(12) United States Patent
Chen et al.

(10) Patent No.: US 10,242,834 B2
(45) Date of Patent: Mar. 26, 2019

(54) METHOD AND DEVICE FOR DETERMINING DIRECTION OF CURRENT FLOWING THROUGH CIRCUIT BREAKER

(71) Applicant: SIEMENS AKTIENGESELLSCHAFT, Munich (DE)

(72) Inventors: Wei Gang Chen, Shanghai (CN); Feng Du, Shanghai (CN); Yue Zhuo, Beijing (CN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 390 days.

(21) Appl. No.: 14/191,729

(22) Filed: Feb. 27, 2014

(65) Prior Publication Data

US 2014/0247528 A1    Sep. 4, 2014

(30) Foreign Application Priority Data

Mar. 1, 2013   (CN) .......................... 2013 1 0066165

(51) Int. Cl.
   *H02H 3/00*   (2006.01)
   *H01H 83/08*  (2006.01)
   (Continued)

(52) U.S. Cl.
   CPC .............. *H01H 83/08* (2013.01); *H02H 7/28* (2013.01); *G01R 19/14* (2013.01)

(58) Field of Classification Search
   CPC .... G01R 19/14; G01R 31/088; G01R 31/085; H01H 83/08; H01H 33/6662
   (Continued)

(56) References Cited

U.S. PATENT DOCUMENTS 3,670,240 A * 6/1972 Maranchak ............ G01R 31/11
                                                    324/535
4,626,772 A * 12/1986 Michel ................. G01R 31/085
                                                    324/551
(Continued)

FOREIGN PATENT DOCUMENTS

CN          1054317 A     9/1991
CN          1455507 A     11/2003
(Continued)

OTHER PUBLICATIONS

Office Action for Corresponding Chinese Patent Application No. 201310066165.4 dated Apr. 19, 2016.
(Continued)

*Primary Examiner* — Thienvu Tran
*Assistant Examiner* — Lucy Thomas
(74) *Attorney, Agent, or Firm* — Harness, Dickey & Pierce, P.L.C.

(57) ABSTRACT

A method and device are disclosed for determining the direction of current flowing through a circuit breaker. An embodiment includes obtaining a sample value of current flowing through the circuit breaker and a differential value of current; obtaining a sample value of voltage at the circuit breaker; on the basis of a relationship between voltage and current in an equivalent circuit in which the circuit breaker lies at the present time and at a previous time, obtaining an equivalent resistance and an equivalent inductance in the equivalent circuit; if the equivalent resistance and equivalent inductance are both greater than zero, determining that the direction of current flowing through the circuit breaker is the same as the current reference direction, and if the equivalent resistance and equivalent inductance are both less than zero, determining that the direction of current flowing through the circuit breaker is opposite to the current reference direction.

19 Claims, 7 Drawing Sheets

(51) Int. Cl.
*H02H 7/28* (2006.01)
*G01R 19/14* (2006.01)

(58) Field of Classification Search
USPC .................................................. 361/82, 42
See application file for complete search history.

(56) References Cited

U.S. PATENT DOCUMENTS

| | | | | |
|---|---|---|---|---|
| 4,857,854 | A * | 8/1989 | Matsushima | G01R 31/088 |
| | | | | 324/512 |
| 6,662,124 | B2 * | 12/2003 | Schweitzer | H02H 1/0007 |
| | | | | 324/76.15 |
| 8,207,742 | B2 * | 6/2012 | Sawhney | H02H 7/262 |
| | | | | 324/512 |
| 2008/0097694 | A1 * | 4/2008 | Petras | G01S 5/0027 |
| | | | | 701/484 |
| 2008/0156775 | A1 * | 7/2008 | Morita | H01H 33/6662 |
| | | | | 218/140 |
| 2013/0015878 | A1 * | 1/2013 | Perera | G01R 31/085 |
| | | | | 324/764.01 |
| 2013/0317768 | A1 | 11/2013 | Yang et al. | |

FOREIGN PATENT DOCUMENTS

| | | |
|---|---|---|
| CN | 101237144 A | 8/2008 |
| CN | 101771269 A | 7/2010 |
| JP | 2003315380 A | 11/2003 |
| JP | 4380451 B2 | 12/2009 |

OTHER PUBLICATIONS

Office Action for Corresponding German Patent Application No. 10 2014 203 366.7 dated Feb. 23, 2017 and English translation thereof.

\* cited by examiner

METHOD AND DEVICE FOR DETERMINING DIRECTION OF CURRENT FLOWING THROUGH CIRCUIT BREAKER

PRIORITY STATEMENT

The present application hereby claims priority under 35 U.S.C. § 119 to Chinese patent application number CN 201310066165.4 filed Mar. 1, 2013, the entire contents of which are hereby incorporated herein by reference.

FIELD

At least one embodiment of the present invention relates generally to protection of power distribution networks, in particular to directional zone selective interlock for circuit breakers in a power distribution network.

BACKGROUND

Zone selective protection, also called zone selective interlock (ZSI: Zone Selectivity Interlock), is a method of reducing the impact on the various power distribution devices in a power distribution network in the event of a short circuit fault by shortening the time needed to eliminate the fault as far as possible. To be specific, suppose that a fault occurs in a multi-level power distribution network supplied by a single power source, then every circuit breaker that detects the fault must report detection of the fault to its upstream circuit breaker, i.e. send an interlock signal. Thus, only those circuit breakers that do not receive a report are determined as being the circuit breakers closest to the fault point, and implement instantaneous protection (for example, delay time t=50 ms), i.e. carry out a breaking action with the shortest delay time. Those circuit breakers which receive an interlock signal carry out timed protection, also called "locking". By timed protection or locking is meant: if a fault has still not been eliminated after a predetermined delay time (e.g. 100 ms) has expired (e.g. the protecting action of a circuit breaker closer to the fault point has failed), then the circuit breaker in question opens; otherwise, it maintains the connection. As can be seen, ZSI enables circuit breakers to perform selective protecting actions when faults occur.

In the case of power distribution networks with multiple power sources, the simple ZSI described above is no longer suitable owing to the increased complexity of the power distribution network. This being the case, the concept of directional zone selective interlock (DISI: Directional Zone Select Interlock) is proposed, with the following basic principle: a fault point is identified on the basis of correlations among the current flow directions through the various circuit breakers when a fault occurs, and the action delay times of the various circuit breakers are then determined in order to eliminate the fault identified. The advantage of this is that selective protection can be realized more reliably even if the network contains multiple power sources or an active load.

In directional zone selective interlock, the accurate determination of the direction of current flowing through a circuit breaker when a fault occurs becomes a key problem. In the prior art, a predetermined current reference direction is generally set for each circuit breaker first. Next, to determine whether the direction of current at the present time is the same as the current reference direction, the sign (positive or negative) of the active power is found by calculation. The active power can be calculated using the following formula.

$$P_m = \frac{1}{N}\sum_{k=0}^{N-1}(v_{m_k} \times i_{m_k}) = VI\cos\varphi_m$$

wherein $P_m$ is the active power of phase m, and m=1, 2 or 3;

N is the total number of sampling points in half a power cycle; for a power frequency of 50 Hz, half a power cycle is for example 10 ms;

k counts the sampling points in half a power cycle ($0 \leq k \leq N$);

$v_{m_k}$ is the sample voltage of phase m to the neutral line at sampling point k;

$i_{m_k}$ is the sample current of phase m at sampling point k;

V is the effective value of voltage of phase m to the neutral line over one power cycle;

I is the effective value of current of phase m over one power cycle;

$\varphi_m$ is the phase angle between current and voltage for phase m.

The active power $P_m$ can be calculated using the above formula. If the $P_m$ calculated is positive, this indicates that the current flowing through the circuit breaker at the present time is in the same direction as the current reference direction, i.e. is "forward". If the $P_m$ calculated is negative, this indicates that the current flowing through the circuit breaker at the present time is in the opposite direction to the current reference direction, i.e. is "backward".

When such a method of determining current direction is adopted, the time taken to determine the current direction depends to a very large degree on the frequency of the power source. For example, if the power source frequency is 50 Hz, sample values must be obtained over half a cycle before the current direction can be determined, so the time taken is theoretically at least 10 ms. In practice, taking into account the effect of short circuit current transient response, the time taken to determine the current direction is generally longer than the theoretical value of 10 ms, for example 15 ms (this is the value obtained when filter parameters are optimized to minimize the effect of short circuit current transient response).

SUMMARY

At least one embodiment of the present invention is directed to a method and/or device for determining the direction of current flowing through a circuit breaker, the adoption of which method and/or device enables the time taken to determine current direction to be made independent of the power source frequency. A further embodiment of the present invention is directed to shortening the time taken to determine current direction, so as to activate directional zone selective protection (DISI) as soon as possible. Another embodiment of the present invention is directed to realizing determination of current direction with as little calculation as possible.

According to one embodiment of the present invention, a method is disclosed for determining the direction of current flowing through a circuit breaker, wherein the circuit breaker has a predetermined current reference direction, the method comprising: obtaining a sample value of current flowing through the circuit breaker and a differential value of current; obtaining a sample value of voltage at the circuit breaker; on the basis of a relationship between voltage and current in an equivalent circuit in which the circuit breaker lies at the present time and at a previous time, obtaining an equivalent resistance R and an equivalent inductance L in the equivalent circuit; if the equivalent resistance R and equivalent inductance L are both greater than zero, determining that the direction of current flowing through the circuit breaker is the same as the current reference direction, and if the equivalent resistance R and equivalent inductance L are both less than zero, determining that the direction of current flowing through the circuit breaker is opposite to the current reference direction. Preferably, the differential value of current is a forward differential value or a backward differential value. More preferably, the differential value of current is the mean value of a forward differential value and a backward differential value.

According to one embodiment of the present invention, a device for determining the direction of current flowing through a circuit breaker comprises: a current acquisition unit, for obtaining a sample value of current flowing through the circuit breaker and a differential value of current; a voltage acquisition unit, for obtaining a sample value of voltage at the circuit breaker; an equivalent impedance calculation unit, for obtaining an equivalent resistance R and an equivalent inductance L in an equivalent circuit in which the circuit breaker lies, on the basis of a relationship between voltage and current in the equivalent circuit at the present time and at a previous time; and a determining unit, wherein if the equivalent resistance R and equivalent inductance L are both greater than zero, it is determined that the direction of current flowing through the circuit breaker is the same as a current reference direction, and if the equivalent resistance R and equivalent inductance L are both less than zero, it is determined that the direction of current flowing through the circuit breaker is opposite to the current reference direction. Preferably, the current acquisition unit uses a forward differential value or a backward differential value calculated on the basis of the sample values of current as the differential value of current.

In another embodiment of the present invention, a circuit breaker protection device is proposed, comprising: a first device for determining the direction of current flowing through a circuit breaker, as described above; a second device, for sending an interlock signal on the basis of a directional zone interlock mechanism, according to the current direction determined by the first device; and an electronic trip unit, for performing a protecting action in the event of a fault once a predetermined interlock time of receiving an interlock signal has expired.

An embodiment of the present invention also proposes a program product, containing machine-readable commands which are capable of realizing any one of the above methods when executed on a machine.

BRIEF DESCRIPTION OF THE DRAWINGS

The objects, characteristics, features and advantages of the present invention will be made more obvious by the following detailed description which refers to the accompanying drawings.

DETAILED DESCRIPTION OF THE EXAMPLE EMBODIMENTS

Figure 1:
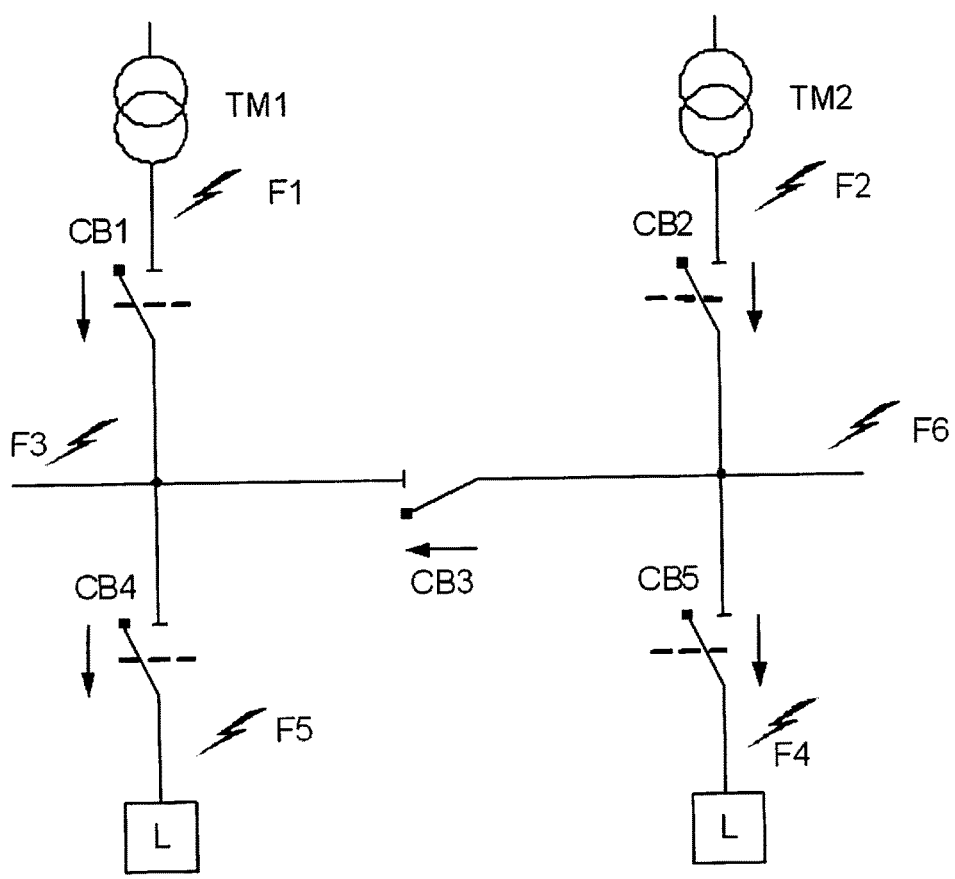
FIG. 1 shows an application scenario for directional zone selective interlock according to an embodiment of the present invention.

The present invention will be further described in detail in conjunction with the accompanying drawings and embodiments. It should be understood that the particular embodiments described herein are only used to illustrate the present invention but not to limit the present invention.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

Various embodiments of the present invention will be described below with reference to the accompanying drawings. Through the following description, the abovementioned advantages of the present invention will become easier to understand.

At least one embodiment of the present invention is directed to a method and/or device for determining the direction of current flowing through a circuit breaker, the adoption of which method and/or device enables the time taken to determine current direction to be made independent of the power source frequency. A further embodiment of the present invention is directed to shortening the time taken to determine current direction, so as to activate directional zone selective protection (DZSI) as soon as possible. Another embodiment of the present invention is directed to realizing determination of current direction with as little calculation as possible.

According to one embodiment of the present invention, a method is disclosed for determining the direction of current flowing through a circuit breaker, wherein the circuit breaker has a predetermined current reference direction, the method comprising: obtaining a sample value of current flowing through the circuit breaker and a differential value of current; obtaining a sample value of voltage at the circuit breaker; on the basis of a relationship between voltage and current in an equivalent circuit in which the circuit breaker lies at the present time and at a previous time, obtaining an equivalent resistance R and an equivalent inductance L in the equivalent circuit; if the equivalent resistance R and equivalent inductance L are both greater than zero, determining that the direction of current flowing through the circuit breaker is the same as the current reference direction, and if the equivalent resistance R and equivalent inductance L are both less than zero, determining that the direction of current flowing through the circuit breaker is opposite to the current reference direction. Preferably, the differential value of current is a forward differential value or a backward differential value. More preferably, the differential value of current is the mean value of a forward differential value and a backward differential value.

In one embodiment of the present invention, the previous time is the sampling time which immediately precedes the present sampling time, and the relationship between voltage and current in the equivalent circuit at the present sampling time is:

$$u(t_n) = R \times i(t_n) + L \times i'(t_n);$$

the relationship between voltage and current in the equivalent circuit at the previous sampling time is:

$$u(t_{n-1}) = R \times i(t_{n-1}) + L \times i'(t_{n-1}),$$

wherein R is the equivalent resistance in the equivalent circuit in which the circuit breaker lies;
L is the equivalent inductance in the equivalent circuit in which the circuit breaker lies;
i(t) is the sample value of current flowing through the circuit breaker at time t, and i'(t) is the differential value of current at time t;
u(t) is the sample value of voltage at the circuit breaker at time t;
$t_n$ is the time of the present $n^{th}$ sampling point, $t_{n-1}$ is the time of the $(n-1)^{th}$ sampling point, and n is an integer greater than zero.

In one embodiment, the differential value i'(t) of current is the mean value of a forward differential and a backward differential, so that:

$$i'(t_n) \approx \frac{i(t_{n+1}) + i(t_{n-1}) - 2 \times i(t_n)}{2\Delta T},$$

$$i'(t_{n-1}) \approx \frac{i(t_n) + i(t_{n-2}) - 2 \times i(t_{n-1})}{2\Delta T}$$

wherein $\Delta T$ is the sampling interval for the sample values of current i(t).

Preferably, the step of obtaining the equivalent resistance R and equivalent inductance L in the present circuit further comprises: obtaining the positive/negative signs of the numerator and denominator in the fractions which form the equivalent resistance R and equivalent inductance L separately; on the basis of the signs of the relevant numerator and denominator, determining the positive/negative signs of the equivalent resistance R and equivalent inductance L obtained.

In one embodiment, the equivalent resistance R and the equivalent inductance L are obtained according to the following formulas:

$$R = \frac{u(t_{n-1}) \times [i(t_{n+1}) - i(t_{n-1})] - u(t_n) \times [i(t_n) - i(t_{n-2})]}{i(t_{n-1}) \times [i(t_{n+1}) - i(t_{n-1})] - i(t_n) \times [i(t_n) - i(t_{n-2})]}$$

$$L = \frac{2 \cdot \Delta T \times [u(t_{n-1}) - R \cdot i(t_n)]}{i(t_{n+1}) - i(t_{n-1})}$$

More preferably, if the current directions determined are all the same for N consecutive moments in time, it is determined that the current direction obtained is the direction of current currently flowing through the circuit breaker, wherein N is a positive integer less than or equal to 10, for example N=3.

According to one embodiment of the present invention, a device for determining the direction of current flowing through a circuit breaker comprises: a current acquisition unit, for obtaining a sample value of current flowing through the circuit breaker and a differential value of current; a voltage acquisition unit, for obtaining a sample value of voltage at the circuit breaker; an equivalent impedance calculation unit, for obtaining an equivalent resistance R and an equivalent inductance L in an equivalent circuit in which the circuit breaker lies, on the basis of a relationship between voltage and current in the equivalent circuit at the present time and at a previous time; and a determining unit, wherein if the equivalent resistance R and equivalent inductance L are both greater than zero, it is determined that the direction of current flowing through the circuit breaker is the same as a current reference direction, and if the equivalent resistance R and equivalent inductance L are both less than zero, it is determined that the direction of current flowing through the circuit breaker is opposite to the current reference direction. Preferably, the current acquisition unit uses a forward differential value or a backward differential value calculated on the basis of the sample values of current as the differential value of current.

In one embodiment, the equivalent impedance calculation unit calculates the equivalent resistance R and equivalent inductance L on the basis of the following formulas, $$u(t_n) = R \times i(t_n) + L \times i'(t_n);$$

$$u(t_{n-1}) = R \times i(t_{n-1}) + L \times i'(t_{n-1}).$$

Here, R is the equivalent resistance in the circuit in which the circuit breaker lies;
L is the equivalent inductance in the circuit in which the circuit breaker lies;
i(t) is the sample value of current flowing through the circuit breaker at time t, and i'(t) is the differential value of current at time t;
u(t) is the sample value of voltage at the circuit breaker at time t;
$t_n$ is the time of the present $n^{th}$ sampling point, and $t_{n-1}$ is the time of the $(n-1)^{th}$ sampling point.

Preferably, the current acquisition unit uses the mean value of a forward differential value and a backward differential value of sample values of current as the differential value of current. More preferably, the equivalent impedance acquisition unit calculates the equivalent resistance R and the equivalent inductance L according to the following formulas, wherein ΔT is the current sampling interval, $$R = \frac{u(t_{n-1}) \times [i(t_{n+1}) - i(t_{n-1})] - u(t_n) \times [i(t_n) - i(t_{n-2})]}{i(t_{n-1}) \times [i(t_{n+1}) - i(t_{n-1})] - i(t_n) \times [i(t_n) - i(t_{n-2})]}$$

$$L = \frac{2 \cdot \Delta T \times [u(t_{n-1}) - R \cdot i(t_n)]}{i(t_{n+1}) - i(t_{n-1})}.$$

Preferably, the equivalent impedance acquisition unit calculates separately the positive/negative signs of the numerator and denominator in the fractions which form the equivalent resistance R and equivalent inductance L, and, on the basis of the signs of the relevant numerator and denominator, determines the positive/negative signs of the equivalent resistance R and equivalent inductance L obtained.

In another embodiment of the present invention, a circuit breaker protection device is proposed, comprising: a first device for determining the direction of current flowing through a circuit breaker, as described above; a second device, for sending an interlock signal on the basis of a directional zone interlock mechanism, according to the current direction determined by the first device; and an electronic trip unit, for performing a protecting action in the event of a fault once a predetermined interlock time of receiving an interlock signal has expired.

An embodiment of the present invention also proposes a program product, containing machine-readable commands which are capable of realizing any one of the above methods when executed on a machine.

FIG. 1 shows by way of example an application scenario of a directional zone selective interlock system according to an embodiment of the present invention, specifically a power distribution network structure in the form of an H bridge. As FIG. 1 shows, the H bridge network comprises two power sources TM1 and TM2, which supply power to two passive loads L, respectively. Circuit breakers (CB) CB1, CB2, CB4 and CB5 are provided on each of the bridge arms of the H bridge structure, respectively, while a connecting circuit breaker CB3 is also provided on the middle bridge. The arrow close to each circuit breaker in FIG. 1 shows a current reference direction. The current reference direction is for example the direction of current flowing through the circuit breaker in normal circumstances (e.g. when the circuit breaker is conducting). In normal circumstances, the current flowing through the connecting circuit breaker CB3 is very small. For this reason, the current reference direction thereof is preset here as, for example, "to the left" as shown in the figure.

In the H bridge structure application scenario shown in FIG. 1, a short circuit fault could occur at 6 fault points as shown in FIG. 1, i.e. fault points F1-F6. Here, the short circuit fault could have several causes; for example, a phase line short circuit could cause the short circuit, or a ground fault could cause the short circuit. In FIG. 1, fault point F1 occurs for example between power source TM1 and circuit breaker CB1; fault point F4 occurs for example on the path from circuit breaker CB5 to a passive load L. For different faults shown in FIG. 1, the direction of transmission of interlock signals between circuit breakers will be somewhat different, according to the principle of ZSI.

Figure 2A:
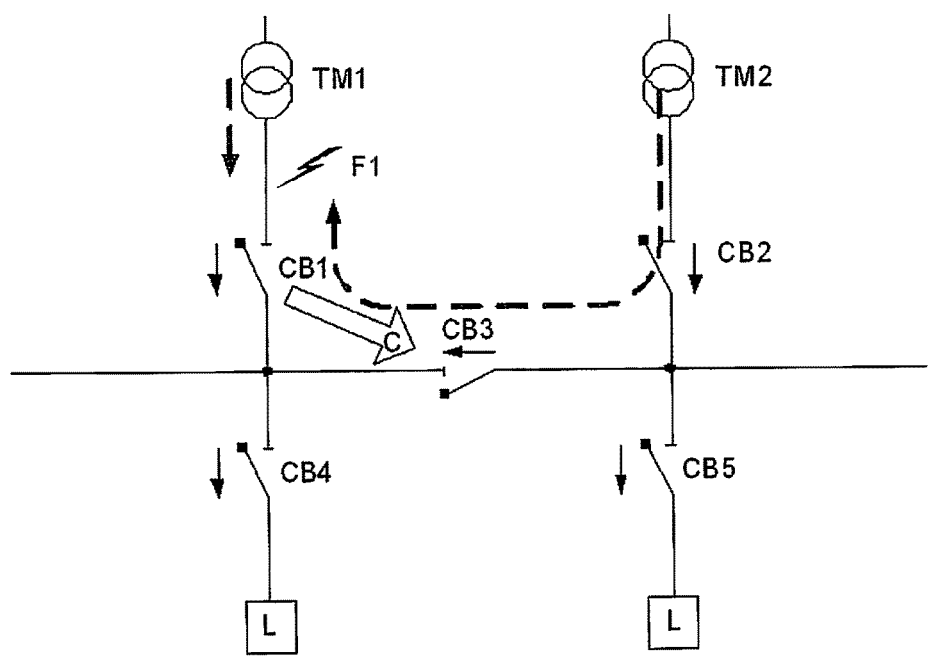
FIG. 2A shows the direction of flow of a fault current when a fault occurs in the scenario shown in FIG. 1.
Figure 2B:
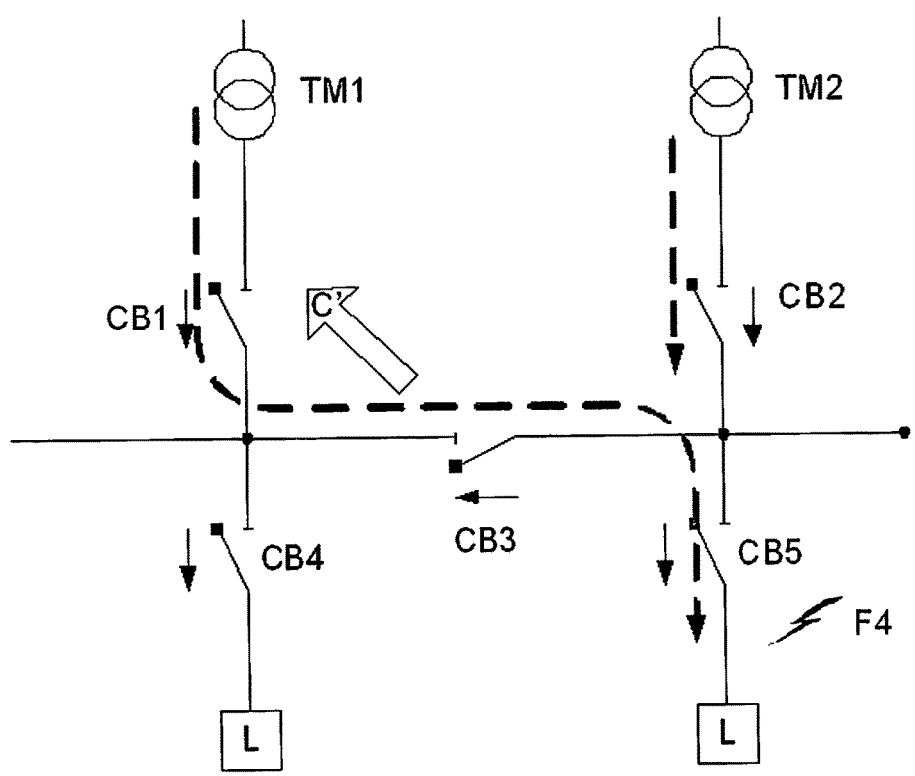
FIG. 2B shows the direction of flow of a fault current when a different fault occurs in the scenario shown in FIG. 1.

FIGS. 2A and 2B show by way of example the direction of flow of fault current and the direction of transmission of interlock signals between circuit breakers in two fault situations, F1 and F4. In FIG. 2A, if a fault occurs at point F1, the currents outputted by TM1 and TM2 form fault currents, and converge at the fault point F1, i.e. the fault currents flow as indicated by the dotted line arrows in FIG. 2A. Once CB1 discovers the fault, it must transmit an interlock signal to CB3 which lies upstream with respect to the fault current direction (as shown by arrow C in the figure). CB3 then detects the fault and then transmits an interlock signal to CB2, which lies upstream of CB3. After receiving the interlock signals, CB2 and CB3 can set their respective protection delay times separately and enter an interlocked state, and only perform a protecting action, i.e. open if a fault is still present after their respective delay times have expired. In FIG. 2B, suppose that a fault occurs at point F4, then currents outputted by TM1 and TM2 form fault currents, and converge at fault point F4, i.e. the fault currents flow as indicated by the dotted line arrows in FIG. 2B. In this case, after detecting the fault, CB3 must transmit an interlock signal to CB1 which lies upstream with respect to the fault current direction (as shown by arrow C' in the figure), so that CB1 sets its action delay time and enters an interlocked state. As can be seen from FIGS. 2A and 2B, in different fault situations, changes in fault current direction are related to the direction of transmission of interlock signals between circuit breakers (such as CB1 and CB3), and so a directional zone selective interlock (DISI) solution must be introduced.

Figure 3A:
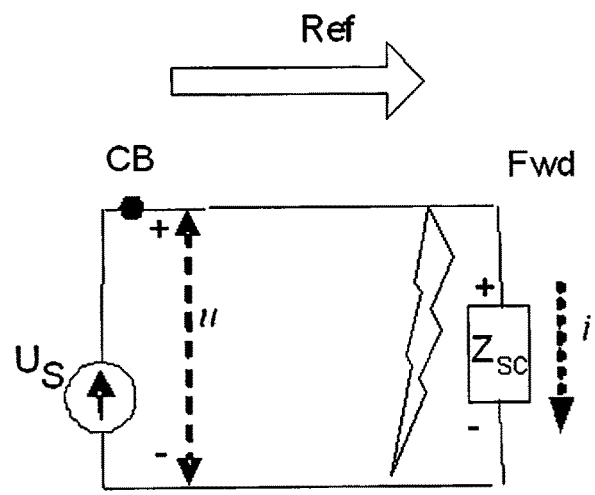
FIGS. 3A and 3B show equivalent circuit diagrams for forward and backward fault currents, respectively.
Figure 3B:
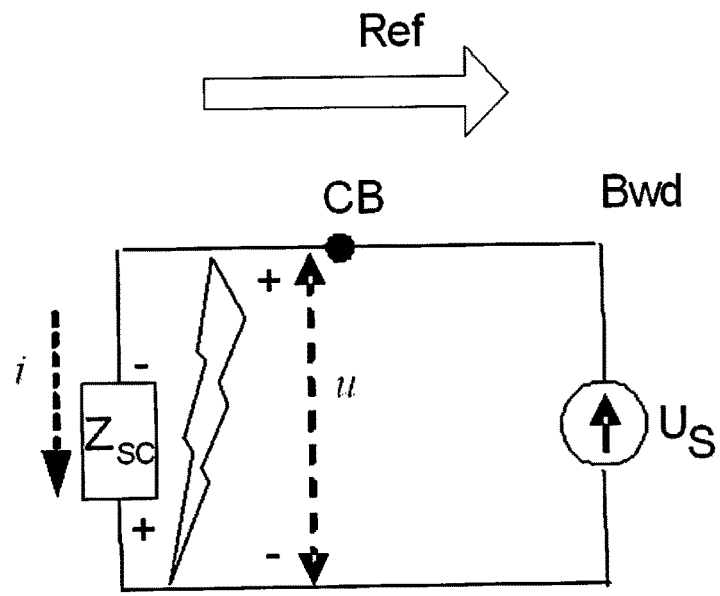

FIGS. 3A and 3B show equivalent circuits observed at a circuit breaker (e.g. CB3) for different fault current directions, respectively. The equivalent circuit comprises an equivalent voltage source Us and an equivalent impedance Zsc connected across the equivalent voltage source Us. In FIG. 3A, the fault current direction F is the same as the current reference direction Ref, so this is called a "forward (Fwd) fault" (e.g. the situation shown in FIG. 2A). In FIG. 3A, the fault current i flows through the equivalent circuit in the current reference direction Ref, and hence satisfies Us=i*Zsc. Here, the size of the equivalent voltage source Us is the same as the voltage u(t) detected at the circuit breaker CB, and the fault current i is the current size i(t) detected at the circuit breaker CB. Therefore, the equivalent circuit in FIG. 3A satisfies u(t)=i(t)*Zsc, i.e. Zsc is positive. In FIG. 3B, unlike FIG. 3A, the fault current direction F is opposite to the current reference direction Ref, so this is called a "backward (Bwd) fault" (e.g. the situation shown in FIG. 2B). In FIG. 3B, taking into account the direction of the fault current, 0=Us+i*$Z_{sc}$. Similarly, the size of the equivalent voltage Us is the same as u(t), and the fault current i is the current i(t) detected at the circuit breaker, giving 0=u(t)+i(t)*Zsc, i.e. Zsc is negative. Furthermore, taking into account the fact that the equivalent impedance Zsc during a short circuit fault mainly comprises an equivalent resistance R and an equivalent inductance L, the following may be obtained: if, during a fault, the equivalent resistance R>0 and the equivalent inductance L>0, then Zsc>0, therefore the fault current direction F is the same as the current reference direction Ref; if, during a fault, the equivalent resistance R<0 and the equivalent inductance L<0, then Zsc<0, therefore the fault current direction F is opposite to the current reference direction Ref. Thus, based on the sizes of the equivalent resistance R and equivalent inductance L in the equivalent circuit, it can be determined whether the direction F of the fault current is the same as the reference current direction Ref.

In the equivalent circuits shown in FIGS. 3A and 3B, the relationship between current and voltage satisfies Ohm's Law, in other words, the sizes of the equivalent resistance R and equivalent inductance L in the equivalent circuit can be calculated on the basis of the relationship between current and voltage at at least two different times. For example, suppose that the equivalent impedance Zsc during a short circuit fault only comprises an equivalent resistance and an equivalent inductance, then the relationship between current and voltage in the equivalent circuit can be expressed as:

$$u(t)=R \times i(t)+L \times i'(t) \quad (1)$$

wherein R is the equivalent resistance in the equivalent circuit in which the circuit breaker lies;
L is the equivalent inductance in the equivalent circuit in which the circuit breaker lies;
i(t) is the sample value of current flowing through the circuit breaker at time t, and i'(t) is the differential value of current at time t;
u(t) is the sample value of voltage at the circuit breaker at time t.

Based on the relation (1) between current and voltage, if current and voltage values at two different times can be measured, then formula (1) can be used to calculate the equivalent resistance R and equivalent inductance L in the equivalent circuit.

Figure 4:
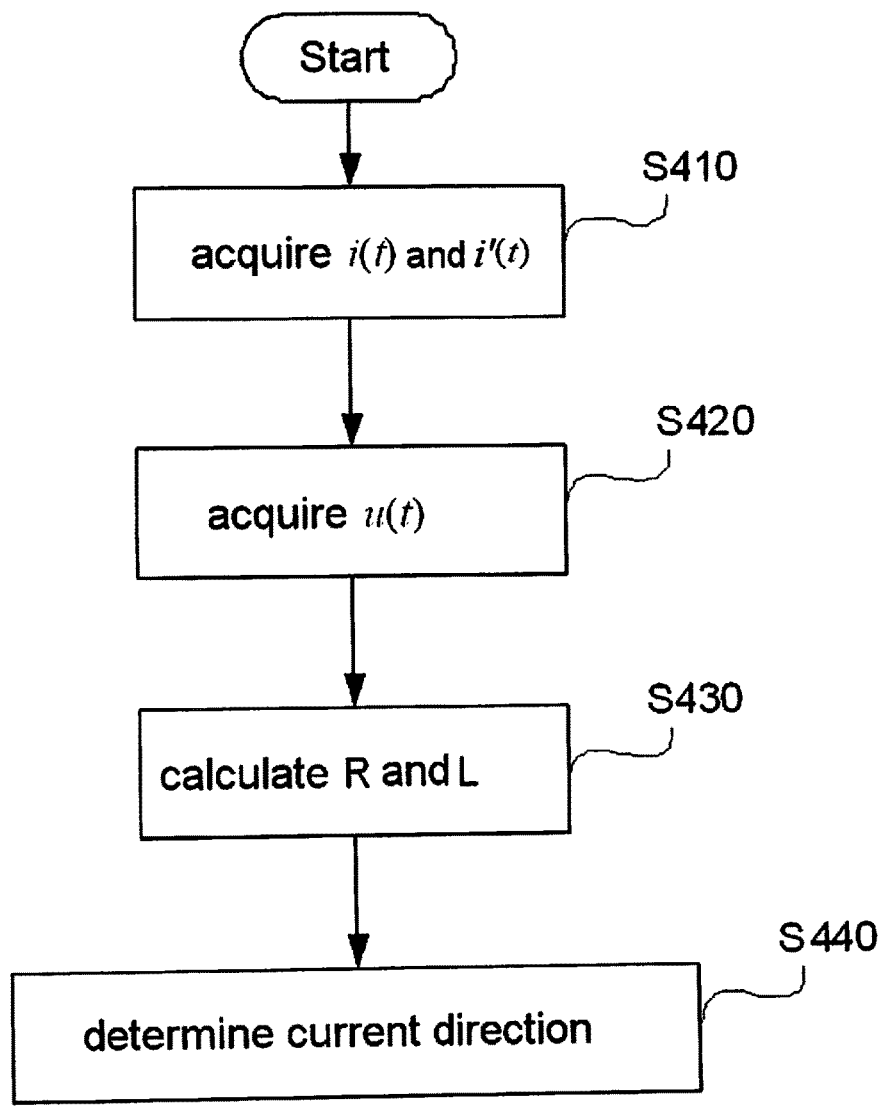
FIG. 4 shows a flow chart of a method for determining the direction of current flowing through a circuit breaker according to an embodiment of the present invention.

FIG. 4 shows a flow chart of a method for determining the direction of current flowing through a circuit breaker according to an embodiment of the present invention. As FIG. 4 shows, in step S410, a sample value of current i(t) flowing through a circuit breaker (e.g. CB3) and a current differential value i'(t) are obtained. Here, the current differential value i'(t) can be obtained directly by an associated differentiating circuit, or calculated on the basis of the sample value of current i(t). In step S420, a sample value of voltage u(t) at the circuit breaker is obtained. Steps S420 and S410 can be performed at the same time, or performed one after another within a short time period. Next, in step S430, on the basis of the relationship between voltage and current (e.g. that shown in formula (1)) in the present circuit at the present time (e.g. the time $t_n$ of the $n^{th}$ sampling point) and a previous time (e.g. the time $t_{n-1}$ of the $(n-1)^{th}$ sampling point), the equivalent resistance R and equivalent inductance L in the present circuit are obtained. In step S440, if the equivalent resistance R and equivalent inductance L are both greater than zero, it is determined that the direction of current flowing through the circuit breaker is the same as the current reference direction Ref; if the equivalent resistance R and equivalent inductance L are both less than zero, it is determined that the direction of current flowing through the circuit breaker is opposite to the current reference direction Ref.

Preferably, sample values of current and voltage at two adjacent sampling times (for example, the time $t_n$ of the present $n^{th}$ sampling point, and the time $t_{n-1}$ of the $(n-1)^{th}$ sampling point) can be chosen in step S430 (of course, sampling point times which are spaced apart can also be used in actual applications), as shown in the formulas below:

$$u(t_n)=R \times i(t_n)+L \times i'(t_n) \quad (2)$$

$$u(t_{n-1})=R \times i(t_{n-1})+L \times i'(t_{n-1}) \quad (3)$$

The following can be obtained from formulas (2) and (3):

$$R = \frac{u(t_{n-1}) \times i'(t_n) - u(t_n) \times i'(t_{n-1})}{i(t_{n-1}) \times i'(t_n) - i(t_n) \times i'(t_{n-1})} \quad (4)$$

$$L = \frac{u(t_{n-1}) \times i(t_n) - u(t_n) \times i(t_{n-1})}{i'(t_{n-1}) \times i(t_n) - i'(t_n) \times i(t_{n-1})} \quad (5)$$

If the sample values of voltage u(t), sample values of current i(t) and differential values i'(t) of sampled current can be detected directly, the equivalent resistance R and equivalent inductance L can be calculated on the basis of formulas (4) and (5). Next, the direction of current flowing through the circuit breaker at the present time is determined according to whether the equivalent resistance R and equivalent inductance L are greater than zero.

Preferably, the differential values i'(t) of current in formulas (4) and (5) can be calculated from the sample values of current i(t). For example, the differential values i'(t) of current can be forward differential values of current, as shown in formulas (6) and (7), or backward differential values of current, as shown in formulas (8) and (9), wherein ΔT is the current sampling interval.

$$i'(t_n) \approx \frac{i(t_{n+1}) - i(t_n)}{\Delta T} \quad (6)$$

$$i'(t_{n-1}) \approx \frac{i(t_n) - i(t_{n-1})}{\Delta T} \quad (7)$$

$$i'(t_n) \approx \frac{i(t_n) - i(t_{n-1})}{\Delta T} \quad (8)$$

$$i'(t_{n-1}) \approx \frac{i(t_{n-1}) - i(t_{n-2})}{\Delta T} \quad (9)$$

More preferably, the differential values i'(t) of current can be the mean values of the forward differential values and backward differential values of current, as shown in formulas (10) and (11).

$$i'(t_n) \approx \frac{i(t_{n+1}) + i(t_{n-1}) - 2 \times i(t_n)}{2\Delta T} \quad (10)$$

$$i'(t_{n-1}) \approx \frac{i(t_n) + i(t_{n-2}) - 2 \times i(t_{n-1})}{2\Delta T} \quad (11)$$

In formulas 6-11, two immediately adjacent sampling points are chosen for both the forward differential and the backward differential. In actual applications, two sampling points which are spaced apart can be chosen to obtain the differential.

In step S430, for example, the equivalent resistance R and equivalent inductance L can be obtained by substituting formulas (10) and (11) into formulas (4) and (5):

$$R = \frac{u(t_{n-1}) \times [i(t_{n+1}) - i(t_{n-1})] - u(t_n) \times [i(t_n) - i(t_{n-2})]}{i(t_{n-1}) \times [i(t_{n+1}) - i(t_{n-1})] - i(t_n) \times [i(t_n) - i(t_{n-2})]} \quad (12)$$

$$L = \frac{2 \cdot \Delta T \times [u(t_{n-1}) - R \cdot i(t_n)]}{i(t_{n+1}) - i(t_{n-1})} \quad (13)$$

In addition, especially preferably, when calculating the equivalent resistance R and equivalent inductance L, the signs of the numerator and denominator of the fractions which form R and L can be calculated separately first. For example, if formulas (12) and (13) are used to calculate R and L, a calculation can be performed first to determine whether the numerator and denominator in formula (12) are positive or negative, respectively; then the equivalent resistance R is determined as being either greater than zero or less than zero according to the positive/negative sign of the numerator and denominator. By the same principle, it is possible to determine conveniently whether the equivalent inductance L is greater than zero or less than zero. Next, if R>0 and L>0, it can be determined that the direction of current is the same as the current reference direction of the circuit breaker; if R<0 and L<0, it can be determined that the direction of current is opposite to the current reference direction of the circuit breaker.

Especially preferably, if the current directions determined by performing the method shown in FIG. 4 are all the same for N consecutive moments in time, it is determined that the current direction obtained is the direction of current currently flowing through the circuit breaker, wherein N is a positive integer less than or equal to 10, and preferably N=3-5.

Figure 5:
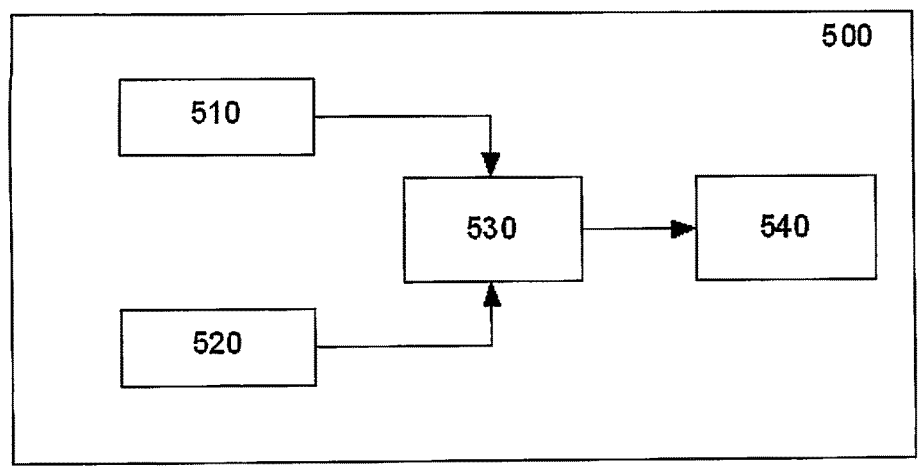
FIG. 5 shows a block diagram of the structure of a device for determining the direction of current flowing through a circuit breaker according to an embodiment of the present invention.

The method flow chart shown in FIG. 4 can be realized using software or hardware. FIG. 5 shows by way of example a block diagram of the structure of a device for determining the direction of current flowing through a circuit breaker according to an embodiment of the present invention. As FIG. 5 shows, a device 500 for determining the direction of current flowing through a circuit breaker comprises: a current acquisition unit 510, a voltage acquisition unit 520, an equivalent impedance calculation unit 530 and a determining unit 540. The current acquisition unit 510 acquires sample values i(t) of current flowing through the circuit breaker and differential values i'(t) of current. The voltage acquisition unit 520 acquires sample values of voltage u(t) at the circuit breaker. The equivalent impedance calculation unit 530 calculates an equivalent resistance R and equivalent inductance L in the present circuit on the basis of the relationship between voltage and current in the circuit at the present time and at a previous time. The determining unit 540 is used to determine the direction of current. Specifically, in the determining unit 540, if the equivalent resistance R and equivalent inductance L are both greater than zero, it is determined that the direction of current flowing through the circuit breaker is the same as a current reference direction R; if the equivalent resistance R and equivalent inductance L are both less than zero, it is determined that the direction of the current is opposite to the current reference direction R.

Preferably, the current acquisition unit 510 can use a forward differential value or backward differential value of current, calculated on the basis of the sample values of current i(t), as a differential value i'(t) of current, or use the mean value of a forward differential value and backward differential value (as shown in formulas 10-11) as a differential value i'(t) of current. The equivalent impedance calculation unit 530 preferably calculates equivalent resistance R and equivalent inductance L according to formulas (12-13). More preferably, the equivalent impedance calculation unit 530 first calculates the positive/negative signs of the numerator and denominator in the fractions (as shown in formulas 12 and 13) which form the equivalent resistance R and equivalent inductance L separately, and then on the basis of the signs of the relevant numerator and denominator, determines whether the equivalent resistance R and equivalent inductance L obtained are positive or negative.

Figure 6A:
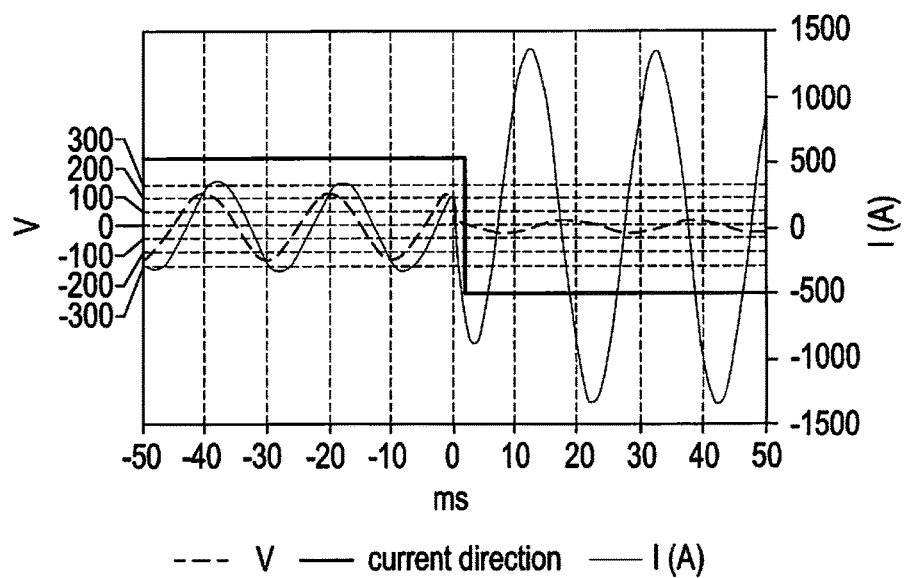
FIGS. 6A and 6B show waveforms of voltage, current and current direction in a simulated result and an experimental result, respectively, under the same fault conditions.
Figure 6B:
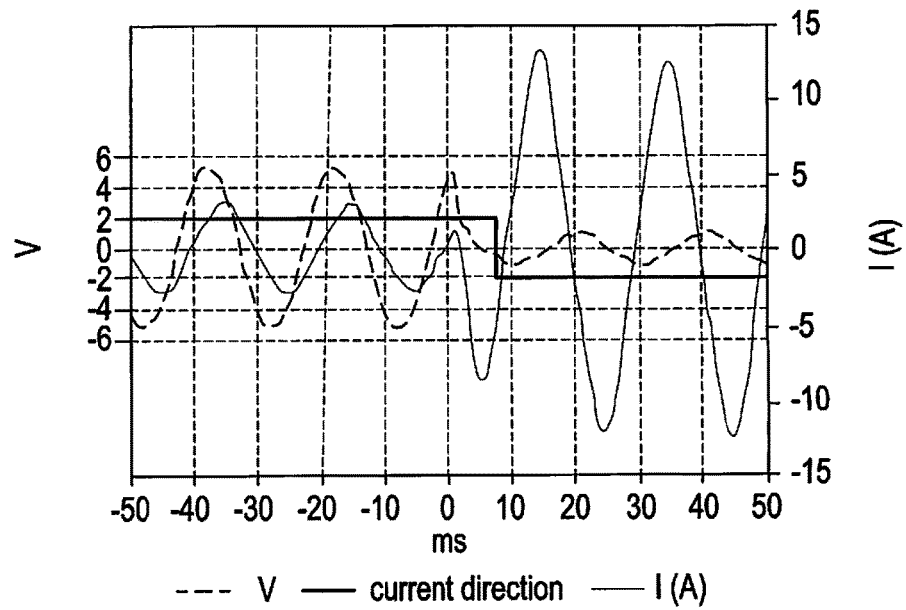

FIGS. 6A and 6B show simulated and experimental waveform graphs of the determination of fault current direction during a short circuit fault using the method for determining current direction according to an embodiment of the present invention, under the same fault conditions. The fault occurs, for example, at fault position F1 in FIG. 2A, and the power factor before the short circuit fault PFN=0.8, the power factor during the short circuit fault PFsc=0.3, the expected value Ip of the fault current is 4.4 times the rated current In (i.e. Ip=4.4 In), the switch phase angle is 90 degrees, and the sampling period for current and voltage is 625 microseconds. FIG. 6A is a simulated waveform graph obtained at circuit breaker CB1 under the abovementioned fault conditions. As can be seen from FIG. 6A, the short circuit fault occurs at 0 microseconds, and, using the method for determining current direction proposed in an embodiment of the present invention, the direction of the fault current is detected as being "backward" at approximately 2.5 ms, i.e. opposite to the reference current direction. FIG. 6B is an experimental waveform obtained at circuit breaker CB1 under the abovementioned fault conditions. As can be seen from FIG. 6B, the short circuit fault occurs at 0 microseconds, and, using the method for determining current direction proposed in the present invention, the direction of the fault current can be detected as being "backward" at approximately 8 ms. Thus, both the experimental and simulated results prove that by using the method and device for determining current direction according to embodiments of the present invention, the current direction can be determined within 10 ms, with no limitation imposed by the power source frequency.

The method and device for determining current direction according to embodiments of the present invention can be applied in, for example, a circuit breaker protection device. For example, such a circuit breaker protection device may comprise: a first device for determining the direction of current flowing through a circuit breaker, for example that shown in FIG. 5; a second device, for sending an interlock signal on the basis of a directional zone interlock mechanism, according to the current direction determined by the first device; and an electronic trip unit, for performing a protecting action in the event of a fault once a predetermined interlock time of receiving an interlock signal has expired.

Those skilled in the art should appreciate that a variety of changes and amendments could be made to the various embodiments disclosed above without departing from the substance of the invention. Such changes and amendments should all fall within the scope of protection of the present invention. Therefore the scope of protection of the present invention should be defined by the accompanying claims.

What is claimed is:

1. A method for determining the direction of current flowing through a circuit breaker connected to a load having at least two power sources arranged at separate conductors, wherein the circuit breaker has a current reference direction from one of the at least two powers sources to a load, the method comprising:
    obtaining a sample value of current flowing through the circuit breaker to another circuit breaker and a differential value of current;
    obtaining a sample value of voltage at the circuit breaker;
    obtaining, in a present circuit in which the circuit breaker and the another circuit breaker lie, on the basis of a relationship between the voltage and the current at the circuit breaker at a present time and at a previous time, an equivalent resistance and an equivalent inductance in the present circuit;
    determining, independent of a frequency of the one of the at least two power sources supplying the present circuit in which the circuit breaker and the another circuit breaker lie and based upon the equivalent resistance and equivalent inductance both being greater than zero, that the direction of current flowing through the circuit breaker is the same as the current reference direction, and determining, based upon the equivalent resistance and equivalent inductance both being less than zero, that the direction of current flowing through the circuit breaker is opposite to the current reference direction, wherein the previous sampling time ($t_{n-1}$) is a sampling time which immediately precedes a present sampling time ($t_n$), and
    sending a directional zone selective interlock signal from the circuit breaker to the another circuit breaker based upon the determined direction of current flow, wherein the relationship between voltage and current in the present circuit at the present sampling time ($t_n$) is:

$$u(t_n) = R \times i(t_n) + L \times i'(t_n);$$

the relationship between voltage and current in the present circuit at the previous sampling time ($t_n$) is:

$$u(t_{n-1}) = R \times i(t_{n-1}) + L \times i'(t_{n-1}),$$

wherein R is the equivalent resistance in the present circuit in which the circuit breaker lies;
L is the equivalent inductance in the present circuit in which the circuit breaker lies;
i(t) is the sample value of current flowing through the circuit breaker at time t, and i'(t) is the differential value of current at time t;
u(t) is the sample value of voltage at the circuit breaker at time t; and
$t_n$ is the time of a present $n^{th}$ sampling point, $t_{n-1}$ is the time of an $(n-1)^{th}$ sampling point, and n is an integer greater than zero.

2. The method of claim 1, wherein the differential value of current is a forward differential value or a backward differential value.

3. The method of claim 1, wherein the differential value of current is a mean value of a forward differential value and a backward differential value.

4. The method of claim 1, wherein the differential value i'(t) of current is a mean value of a forward differential and a backward differential, so that:

$$i'(t_n) \approx \frac{i(t_{n+1}) + i(t_{n-1}) - 2 \times i(t_n)}{2\Delta T},$$

$$i'(t_{n-1}) \approx \frac{i(t_n) + i(t_{n-2}) - 2 \times i(t_{n-1})}{2\Delta T}$$

wherein $\Delta T$ is the sampling interval for the sample values of current i(t).

5. The method of claim 4, wherein the obtaining of the equivalent resistance and equivalent inductance in the present circuit further comprises:
    obtaining positive/negative signs of a numerator and denominator in fractions which form the equivalent resistance and equivalent inductance separately; and
    determining, on the basis of the signs of the relevant numerator and denominator, the positive/negative signs of the equivalent resistance and equivalent inductance obtained.

6. The method of claim 5, wherein the equivalent resistance R and the equivalent inductance L are obtained according to the following formulas:

$$R = \frac{u(t_{n-1}) \times [i(t_{n+1}) - i(t_{n-1})] - u(t_n) \times [i(t_n) - i(t_{n-2})]}{i(t_{n-1}) \times [i(t_{n+1}) - i(t_{n-1})] - i(t_n) \times [i(t_n) - i(t_{n-2})]}$$

$$L = \frac{2 \cdot \Delta T \times [u(t_{n-1}) - R \cdot i(t_n)]}{i(t_{n+1}) - i(t_{n-1})}.$$

7. The method of claim 1, wherein, if current directions determined are all the same for N consecutive moments in time, the determining determine s that the current direction obtained is the direction of current currently flowing through the circuit breaker, wherein N is a positive integer less than or equal to 10.

8. The method of claim 7, wherein N=3.

9. A device for determining a direction of current flowing through a circuit breaker connected to a load having at least two power sources arranged at separate conductors, the device comprising:
memory storing computer-readable instructions; and
one or more processors configured to execute the computer-readable instructions such that the one or more processors are configured to perform operations including,
obtaining a sample value of current flowing through the circuit breaker to another circuit breaker and a differential value of current;
obtaining a sample value of voltage at the circuit breaker;
obtaining an equivalent resistance and an equivalent inductance in a present circuit in which the circuit breaker and the another circuit breaker lie, on the basis of a relationship between voltage and current in the present circuit at the present time and at a previous time;
determining, independent of a frequency of one of the at least two power source supplying the present circuit in which the circuit breaker and the another circuit breaker lie and based upon the equivalent resistance and equivalent inductance both being greater than zero, that the direction of current flowing through the circuit breaker is the same as a current reference direction, and configured to determine, based upon the equivalent resistance and equivalent inductance both being less than zero, that the direction of current flowing through the circuit breaker is opposite to the current reference direction, the current reference direction being a direction of current from one of the at least two power sources to the load, and
sending a directional zone selective interlock signal from the circuit breaker to the another circuit breaker based upon the determined direction of current flow, wherein the device is configured to calculate the equivalent resistance (R) and equivalent inductance (L) on the basis of the following formulas, $u(t_n)=R \times i(t_n)+L \times i'(t_n)$;

$u(t_{n-1})=R \times i(t_{n-1})+L \times i'(t_{n-1})$ wherein R is the equivalent resistance in the circuit in which the circuit breaker lies;
L is the equivalent inductance in the circuit in which the circuit breaker lies;
i(t) is a sample value of current flowing through the circuit breaker at time t, and i'(t) is a differential value of current at time t;
u(t) is a sample value of voltage at the circuit breaker at time t;
$t_n$ is a time of the present $n^{th}$ sampling point, and $t_{n-1}$ is a time of an $(n-1)^{th}$ sampling point.

10. The device of claim 9, wherein the device is configured to use a forward differential value or a backward differential value calculated on the basis of the sample values of current as the differential value of current.

11. The device of claim 9, wherein the device is configured to use the mean value of a forward differential value and a backward differential value of sample values of current as the differential value of current.

12. The device of claim 11, wherein the device is configured to calculate the equivalent resistance (R) and the equivalent inductance (L) according to the following formulas, wherein ΔT is the current sampling interval, $$R = \frac{u(t_{n-1}) \times [i(t_{n+1}) - i(t_{n-1})] - u(t_n) \times [i(t_n) - i(t_{n-2})]}{i(t_{n-1}) \times [i(t_{n+1}) - i(t_{n-1})] - i(t_n) \times [i(t_n) - i(t_{n-2})]}$$

$$L = \frac{2 \cdot \Delta T \times [u(t_{n-1}) - R \cdot i(t_n)]}{i(t_{n+1}) - i(t_{n-1})}.$$

13. The device of claim 12, wherein the device is configured to separately calculate the positive/negative signs of the numerator and denominator in the fractions which form the equivalent resistance (R) and equivalent inductance (L); and, on the basis of the signs of the relevant numerator and denominator, is configured to determine the positive/negative signs of the equivalent resistance (R) and equivalent inductance (L) obtained.

14. A circuit breaker protection device, comprising:
a first device, configured to determine a direction of current flowing through the circuit breaker of claim 9;
a second device, configured to send an interlock signal on the basis of a directional zone interlock mechanism, according to the current direction determined by the first device; and
an electronic trip unit, configured to perform a protecting action in an event of a fault once a predetermined interlock time of receiving an interlock signal has expired.

15. A program product, containing machine-readable commands capable of realizing the method of claim 1 when executed on a machine.

16. A circuit breaker protection device, comprising:
a first device, configured to determine a direction of current flowing through the circuit breaker of claim 10;
a second device, configured to send an interlock signal on the basis of a directional zone interlock mechanism, according to the current direction determined by the first device; and
an electronic trip unit, configured to perform a protecting action in an event of a fault once a predetermined interlock time of receiving an interlock signal has expired.

17. A program product, containing machine-readable commands capable of realizing the method of claim 2 when executed on a machine.

18. The method of claim 1, wherein time taken to determine the direction of the current is independent of a frequency of the power source.

19. The device of claim 9, wherein time taken to determine the direction of the current is independent of a frequency of the power source.

* * * * *